(12) United States Patent
Yu et al.

(10) Patent No.: US 8,999,179 B2
(45) Date of Patent: Apr. 7, 2015

(54) CONDUCTIVE VIAS IN A SUBSTRATE

(75) Inventors: Chen-Hua Yu, Hsin-Chu (TW);
Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 513 days.

(21) Appl. No.: 13/198,354

(22) Filed: Aug. 4, 2011

(65) Prior Publication Data
US 2013/0034816 A1  Feb. 7, 2013

(51) Int. Cl.
*H01B 13/00* (2006.01)
*G03F 7/20* (2006.01)
*H01K 3/10* (2006.01)

(52) U.S. Cl.
CPC ... *G03F 7/20* (2013.01); *H01K 3/10* (2013.01)

(58) Field of Classification Search
None
See application file for complete search history.

(56) References Cited

U.S. PATENT DOCUMENTS

| | | | | |
|---|---|---|---|---|
| 2,310,374 | A | * | 2/1943 | Rummelsburg ............... 530/211 |
| 2,515,276 | A | * | 7/1950 | Swift ............................. 252/8.05 |
| 4,672,403 | A | * | 6/1987 | Jennings ........................ 257/606 |
| 5,371,654 | A | | 12/1994 | Beaman et al. |
| 5,374,291 | A | | 12/1994 | Yabe et al. |
| 5,391,917 | A | | 2/1995 | Gilmour et al. |
| 5,510,298 | A | | 4/1996 | Redwine |
| 5,767,001 | A | | 6/1998 | Bertagnolli et al. |
| 5,998,292 | A | | 12/1999 | Black et al. |
| 6,184,060 | B1 | | 2/2001 | Siniaguine |
| 6,228,787 | B1 | | 5/2001 | Pavel |
| 6,322,903 | B1 | | 11/2001 | Siniaguine et al. |
| 6,339,197 | B1 | * | 1/2002 | Fushie et al. ................... 174/262 |
| 6,448,168 | B1 | | 9/2002 | Rao et al. |
| 6,465,892 | B1 | | 10/2002 | Suga |
| 6,472,293 | B1 | | 10/2002 | Suga |
| 6,511,793 | B1 | | 1/2003 | Cho et al. |
| 6,538,333 | B2 | | 3/2003 | Kong |
| 6,599,778 | B2 | | 7/2003 | Pogge et al. |
| 6,623,906 | B2 | | 9/2003 | Iha |
| 6,639,303 | B2 | | 10/2003 | Siniaguine |
| 6,664,129 | B2 | | 12/2003 | Siniaguine |
| 6,693,361 | B1 | | 2/2004 | Siniaguine et al. |
| 6,740,582 | B2 | | 5/2004 | Siniaguine |
| 6,780,565 | B2 | | 8/2004 | Iha |
| 6,800,930 | B2 | | 10/2004 | Jackson et al. |
| 6,841,883 | B1 | | 1/2005 | Farnworth et al. |
| 6,882,030 | B2 | | 4/2005 | Siniaguine |
| 6,924,551 | B2 | | 8/2005 | Rumer et al. |
| 6,962,867 | B2 | | 11/2005 | Jackson et al. |
| 6,962,872 | B2 | | 11/2005 | Chudzik et al. |
| 7,030,481 | B2 | | 4/2006 | Chudzik et al. |
| 7,049,170 | B2 | | 5/2006 | Savastiouk et al. |
| 7,060,601 | B2 | | 6/2006 | Savastiouk et al. |

(Continued)

OTHER PUBLICATIONS

Bose, IC Fabrication Technology,2014,McGaw Hill, ISBN 13: 978-1-25-902958-5, p. 58-59.*

(Continued)

*Primary Examiner* — Binh X Tran
*Assistant Examiner* — David Cathey, Jr.
(74) *Attorney, Agent, or Firm* — Slater & Matsil, L.L.P.

(57) ABSTRACT

A method of forming a conductive via in a substrate includes forming a via hole covered by a dielectric layer followed by an annealing process. The dielectric layer can getter the mobile ions from the substrate. After removing the dielectric layer, a conductive material is formed in the via hole, forming a conductive via in the substrate.

20 Claims, 3 Drawing Sheets

(56) References Cited

U.S. PATENT DOCUMENTS

| | | |
|---|---|---|
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,167,608 B2 | 1/2007 | Ogawa |
| 7,193,308 B2 | 3/2007 | Matsui |
| 7,193,311 B2 | 3/2007 | Ogawa et al. |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,738,258 B2 | 6/2010 | Ohno et al. |
| 2002/0058398 A1* | 5/2002 | Chang et al. .......... 438/484 |
| 2006/0202322 A1 | 9/2006 | Kariya et al. |
| 2007/0205486 A1 | 9/2007 | Shioga et al. |
| 2008/0036092 A1* | 2/2008 | Gambino et al. ......... 257/774 |
| 2009/0057879 A1 | 3/2009 | Garrou et al. |
| 2011/0170268 A1 | 7/2011 | Takemura et al. |
| 2011/0193221 A1 | 8/2011 | Hu et al. |
| 2011/0195360 A1* | 8/2011 | Flemming et al. ......... 430/314 |
| 2011/0285005 A1 | 11/2011 | Lin et al. |
| 2011/0291288 A1 | 12/2011 | Wu et al. |

OTHER PUBLICATIONS

Oborina, E., et al., "Hydrogen-related mobile charge in the phosphosilicate glass-$SiO_2$-Si structure," Journal of Applied Physics, vol. 92, No. 11, Dec. 1, 2002, pp. 6773-6777.

Schröder, H., et al., "*glassPack*—A 3D Glass Based Interposer Concept fo SiP with Integrated Optical Interconnects," Electronic Components and Technology Conference, 2010, pp. 1647-1652.

Tummala, R.R., et al., "Trend from ICs to 3D ICs to 3D Systems," IEEE 2009 Custom Intergrated Circuits Conference (CICC), pp. 439-444.

* cited by examiner

CONDUCTIVE VIAS IN A SUBSTRATE

CROSS-REFERENCE TO RELATED APPLICATION

The present application is related to co-pending U.S. patent application Ser. No. 12/834,943, filed on Jul. 13, 2010, which is expressly incorporated by reference herein in their entirety

BACKGROUND

To increase the density of package structures, multiple dies may need to be packaged in a same package structure. To accommodate multiple dies, an interposer is typically used to bond dies thereon and the resulting structure including the interposer and the dies are treated as a single structure which may be bonded to a printed circuit board (PCB). It is desirable to form silicon interposers due to the fact that the technology for handling silicon substrates is mature. Further, features formed on silicon interposers may have a high density. However, due to various factors, such as the significant difference between the coefficient of thermal expansion (CTE) of silicon and the CTE of the PCB, it is difficult to bond a silicon interposer directly on a PCB without incurring reliability issues.

A solution for the above-discussed problem is to insert an organic substrate between the silicon interposer and the PCB. This solution, however, still suffers from other issues. Firstly, organic substrates have a high cost. Secondly, organic substrates are typically soft, and hence may not be able to provide enough protection needed by other package components. Thirdly, the signal loss in organic substrates is high, particularly when the signal has a high frequency.

Current approach is to investigate the use of glass as the interposer substrate due to higher resistivity and lower dielectric constant of glass compared with silicon. The substrates can also be etched deep into the material with high aspect ratios and this technology has been gaining in through-glass via fabrication. However, the substrates typically include mobile ions, such as alkaline ions, which diffuse into the conductive vias and induce mobile charges in the interposer. These induced charges will cause capacitance variations and inductance loss, degrading the integrity of further device processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
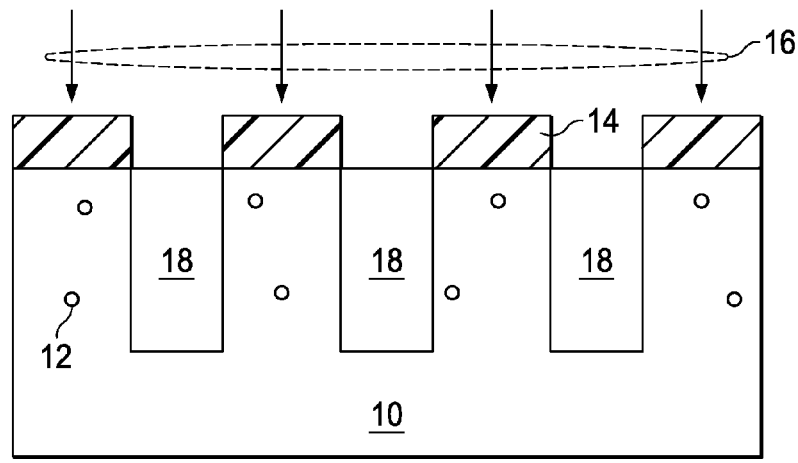
FIG. 1 through FIG. 6 are cross-sectional views of intermediate stages in the manufacturing of a conductive via in a substrate in accordance with an embodiment.

This disclosure provides embodiments of conductive vias in a substrate and processes of forming the same. The substrate with the conductive vias can be used as an interposer applied to three-dimensional integrated circuit (3D-IC) stacks, two-dimensional module-level integration stacks, and/or any advanced package technology fields. The substrate with the conductive vias may also be used as a structured substrate applied to micromachining and micro-fabrication processes. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-6 are cross-sectional views of intermediate stages in the manufacturing of a conductive via in a substrate in accordance with an embodiment.

With reference to FIG. 1, there is shown a cross-sectional diagram of a substrate 10 exposed to a light 16 using a mask 14. In an embodiment, the substrate 10 is formed of a glass material. In another embodiment, the substrate 10 is formed of a photo-sensitive glass material. In alternative embodiments, the substrate 10 is a composite substrate including a photo-sensitive glass layer. In some embodiments, the substrate 10 is formed photo-etchable glass which includes photo-sensitive and etch-sensitive agents for the fabrication of a wide variety of openings using light exposure and etching processes. For example, the photo-sensitive and etch-sensitive agents include mobile ions 12 such as Na, K, Li, alkaline ions or the like. In some embodiments, the substrate includes passive and/or active devices, such as resistors and transistors.

In fabricating via holes, the substrate 10 is exposed to the light 16 in accordance with a pattern defined on the mask 14. Through the patterned mask 14, the exposed portions 18 of the substrate 10 are subject to the light exposure. In an embodiment, the mask 14 includes a photoresist layer formed on the substrate 10. The photoresist layer (not shown) is patterned by exposure, bake, developing, and/or other photolithography processes to provide patterned openings. In alternative embodiments, the mask layer 14 further includes a hard mask layer underlying the photoresist layer. The hard mask layer may be formed of a silicon nitride layer, a silicon oxynitride layer or the like. The hard mask layer also has patterned openings corresponding to the photoresist layer by the use of etching process with the patterned photoresist layer as the mask. In an embodiment, the light 16 is an ultraviolet (UV) light from an ultraviolet radiation exposure system. In some embodiments, the light 16 may be a laser emission from a laser-based exposure system. For example, the wavelength of the light may be approximately from about 200 nm to about 380 nm; but other wavelengths such as from about 10 nm to about 200 nm may also be used. The substrate 10 may then be heated to a temperature near the glass transformation temperature to transform at least part of the exposed portions 18 of glass into a crystalline material.

Figure 2:
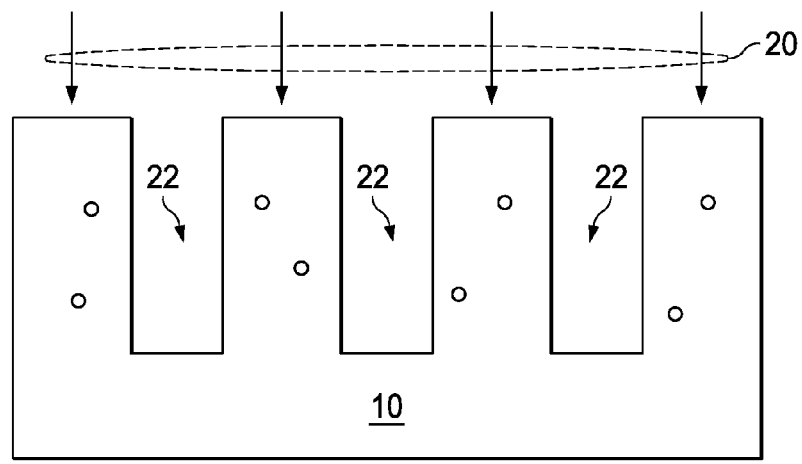

With reference to FIG. 2, the substrate 10 is treated with an etching process 20 to etch the exposed portions 18 defined by the mask layer 14, forming via holes 22 in the substrate 10. The via holes 22 pass through at least a portion of the substrate 10. By controlling the etching parameters, the etching process 20 results in an etch ratio of the exposed portion 18 to the unexposed portion so as to form the via hole 22 of a high ratio of via depth to via diameter. In one embodiment, the via hole 22 has a via depth to via diameter ratio of approximately from about 10:1 to about 50:1. For example, the via hole 22 has a via depth of approximately from about 20 μm to about 100 μm, and a via diameter of approximately from about 1.5 μm to about 10 μm. The etching process 20 may be a wet etching, a dry etching or a laser etching process. In some embodiments, the etching process 20 is a wet etching process which uses an etchant including HF, hydrochloric acid, nitric acid, or combinations thereof.

Figure 3:
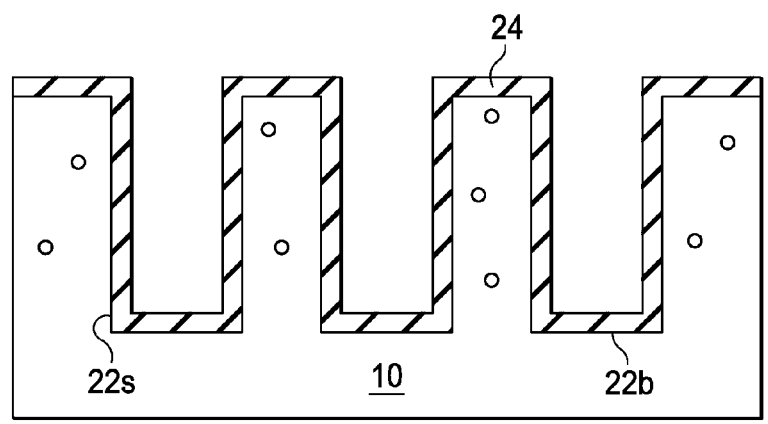

In order to remove unwanted mobile ions from the substrate 10, a dielectric layer is deposited followed by a thermal process to getter or trap the mobile ions in the dielectric layer. As shown in FIG. 3, after removing the mask 14 from the substrate 10, a dielectric layer 24 is deposited on the resulting structure 3. In an embodiment, the dielectric layer 24 covers the surfaces of the substrate 10 and covers the sidewall surfaces 22s and bottom surfaces 22b of the via holes 22. The dielectric layer 24 is formed of a material having abilities to getter or trap alkali ions or any other mobile ions. In an embodiment, the dielectric layer 24 is a phosphosilicate glass (PSG) layer, which may be formed of a thickness about 100 to about 300 Angstroms by plasma enhanced chemical vapor deposition (PECVD) at a temperature of about 400 to about 500° C. In an alternative embodiment, the dielectric layer 24 is a borophosphosilicate glass (BPSG), which may be formed of a thickness about 100 to about 300 Angstroms by plasma enhanced chemical vapor deposition (PECVD) at a temperature of about 400 to about 500° C.

Figure 4:
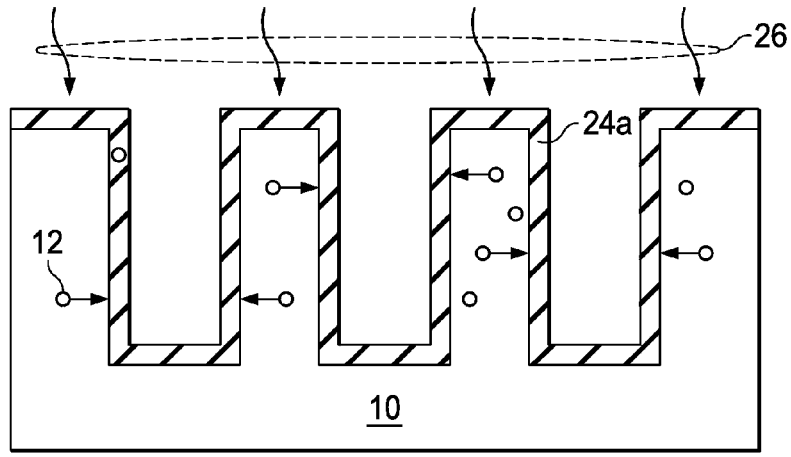

Next as shown in FIG. 4, an annealing process 26 is performed to make the dielectric layer 24 getter or absorb some of the mobile ions 12, resulting in an ion-gettering layer 24a. The ion-gettering layer 24a may include some of unwanted mobile ions that may impact the electrical performance. For example, K ions, Na ions, Li ions or the like can be trapped in the PSG layer. During the annealing process 26, the value of cumulative mobile charge may degrade depending on the annealing history. For example, the mobile ions 12 were driven toward the dielectric layer 24 (as shown by arrows) and then are trapped or absorbed in the dielectric layer 24. It is observed that the mobile charge measured from the substrate 10 is lowered after the annealing process 26. In some embodiments, the substrate 10 is free of Na ions, K ions or other alkaline ions after the annealing process 26. The annealing process 26 can be performed by a variety of techniques, such as furnace annealing, rapid thermal annealing, laser annealing, simulated annealing, or the like. In an embodiment, the annealing process 26 is performed at a temperature between about 600° C. to about 900° C. The annealing process 26 may be performed at a temperature higher than 900° C. for a shorter period of time.

Figure 5:
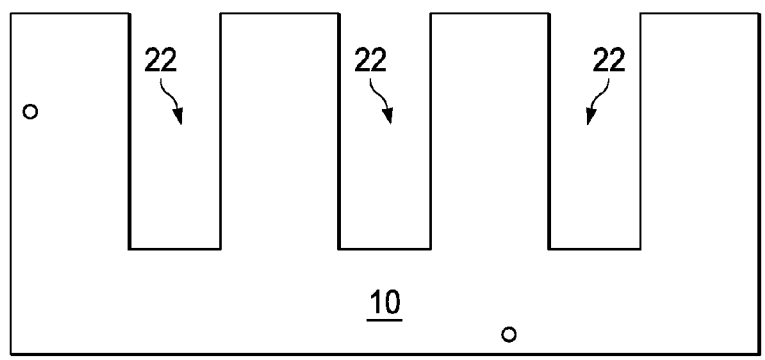

The ion-gettering layer 24a including the mobile ions 12 trapped in the dielectric layer 24 is then removed from the substrate 10 as shown in FIG. 5. In an embodiment, a wet etching process is used to remove the ion-gettering layer 24a. The wet etching process may use an etchant including a mixture of $NH_4OH$ and $H_2O_2$ at a temperature greater than about 55° C. This moves the alkali or alkaline earth ions away from the substrate 10.

Figure 6:
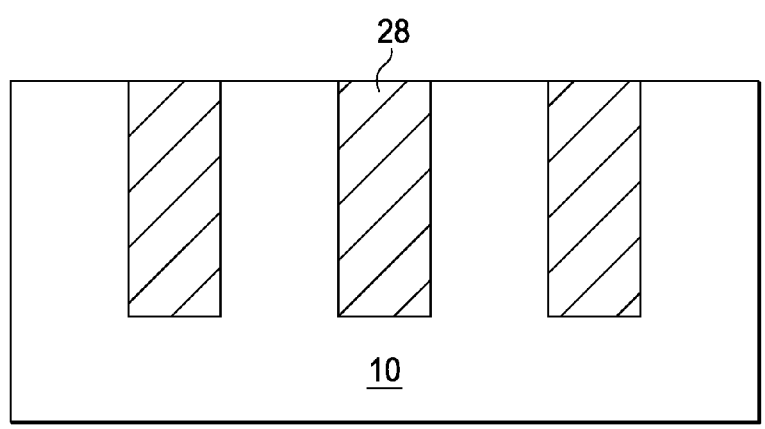

Thereafter, conductive via formation is performed in the via holes 22 to form conductive vias 28 in the substrate 10 as shown in FIG. 6. In an embodiment, the formation of the conductive vias 28 includes a plating process for fill the via holes 22 with a metallic material, and then remove excess portions of the metallic material over substrate 10. Some mobile ions are effectively trapped in the dielectric layer 24, and the ion-gettering layer 24a is removed prior to the conductive via formation, therefore the electric-field induced charge in the substrate 10 is eliminated. This can control the capacitance of the individual conductive via 28 well and prevent inductance loss in the substrate 10 applied for glass interposer technique.

In some embodiments, the metallization process of the conductive vias 26 uses a low resistivity conductor material selected from the group of conductor materials including, but is not limited to, copper and copper-based alloy. For example, a copper-fill process includes metal seed layer deposition and copper electro plating. The metal seed layer deposition may be formed by physical vapor deposition. Other methods for forming copper seed layer, such as CVD are known in the art. Then substrate 10 is transferred to a plating tool, such as an electrochemical plating (ECP) tool, and a copper layer is plated to fill the via holes 22. While ECP process is described herein, the embodiment is not limited to ECP deposited metal. Alternatively, the conductive material may include various materials, such as tungsten, aluminum, gold, silver, and the like. In some embodiments, a barrier layer is formed in the via holes 22 prior to the copper plating process. Refractory metals, refractory metal-nitrides, refractory metal-silicon-nitrides and combinations thereof are typically used for the barrier layer. The diffusion barrier layer may include, but is not limited to, a refractory material, TiN, TaN, Ta, Ti, TiSN, TaSN, W, WN, Cr, Nb, Co, Ni, Pt, Ru, Pd, Au, CoP, CoWP, NiP, NiWP, mixtures thereof, or the like by means of PVD, CVD, ALD or electroplating. Next, if desired, the excess portions of the conductive material layer and/or the barrier layer which are positioned outside the via holes 22 are removed, e.g., through a chemical mechanical polishing (CMP) process. Subsequently, back-end-of-line (BEOL) interconnection technologies will be processed on the substrate 10 to fabricate an interconnection structure including a plurality of interconnection layers and inter-metal dielectric (IMD) layers. In some embodiments, copper-based conductive materials are used for forming the interconnection layers. A standard damascene process may be used with the copper BEOL interconnection.

Figure 7:
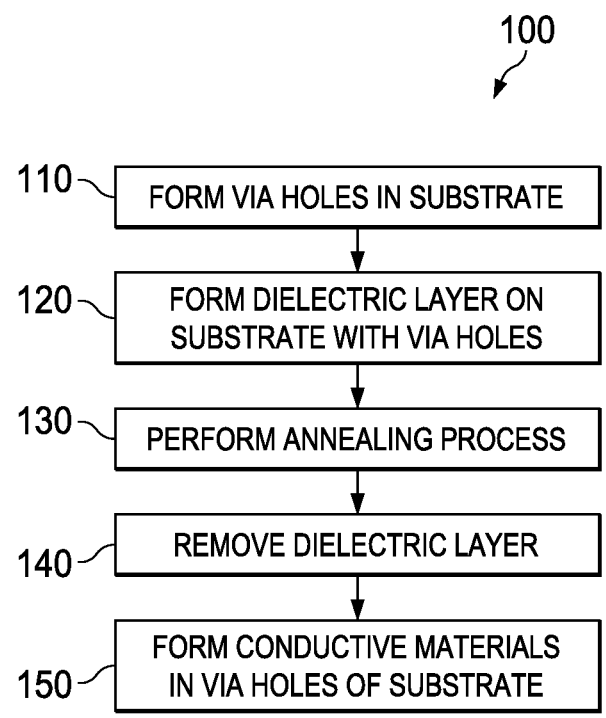
FIG. 7 is a flow chart of a method for fabricating conductive vias in a substrate according to various aspects of the present disclosure.

FIG. 7 is a flow chart of the method for fabricating conductive vias in a substrate according to various aspects of the present disclosure. The method 100 begins with block 110 in which a plurality of via holes are formed in a substrate. The via holes may have a via depth to via diameter ratio greater than 10:1. The method 100 continues with block 120 in which a dielectric layer is formed on the substrate to cover the via holes. In one embodiment, the dielectric layer is a PSG layer. The PSG layer may have a thickness of about 100 to about 300 Angstroms. In an alternative embodiment, the dielectric layer is a BPSG layer. The deposition process of the dielectric layer may be carried out using any of a variety of techniques. The deposition process may be performed at temperature of about 400° C. to about 500° C. The method 100 continues with block 130 in which an annealing process is performed on the dielectric layer. The annealing process can degrade the mobile charge in the substrate, and at least one of mobile ions in the substrate can be trapped or absorbed in the dielectric layer. In some embodiments, the annealing process is performed at a temperature of about 600° C. to about 900° C. The method 100 continues with block 140 in which the dielectric layer is removed form the substrate. In an embodiment, the dielectric layer is removed by a wet etching process. In some embodiments, the wet etching process may use a mixture of $NH_4OH$ and $H_2O_2$, and may perform at a temperature greater than about 55° C. The method 100 continues with block 150 in which a metallization process is performed to form conductive vias in the via holes of the substrate. Some mobile ions are effectively trapped in the dielectric layer, and the ion-gettering layer is removed prior to the conductive via formation, therefore the electric-filed induced charge in the substrate is eliminated.

In according with one aspect of the exemplary embodiment, a method of forming a conductive via including forming a via hole in a substrate, forming a dielectric layer covering the sidewall surface and bottom surface of the via hole, performing an annealing process on the dielectric layer, removing the dielectric layer, and forming a conductive material in the via hole. The formation of the via hole in the substrate includes performing a light exposure on the substrate, and performing a wet etching process to remove the exposed portion of the substrate. The dielectric layer may be a phosphosilicate glass (PSG) layer or a borophosphosilicate glass (BPSG) layer. The substrate may be a photosensitive glass material which includes mobile ions before forming the dielectric layer on the substrate. At least one of the mobiles in the substrate can be removed after performing the annealing process on the dielectric layer. The conductive material comprises copper. The substrate with conductive vias may be applied for interposer techniques.

In accordance with another aspect of the exemplary embodiment, a method of forming an interposer includes forming a via hole in a substrate. The substrate has mobile ions existed therein. A dielectric layer is formed on the sidewall surfaces and bottom surfaces of the via holes to getter at least one of the mobile ions. After removing the dielectric layer, a conductive material is formed in the via hole. The formation of the via hole in the substrate includes performing a light exposure on the substrate, and performing a wet etching process to remove the exposed portion of the substrate. The substrate may be a photosensitive glass material which includes mobile ions before forming the dielectric layer on the substrate. The formation of the dielectric layer includes depositing a dielectric layer and performing an annealing process. The dielectric layer may be a phosphosilicate glass (PSG) layer or a borophosphosilicate glass (BPSG) layer. At least one of the mobiles in the substrate can be removed after performing the annealing process on the dielectric layer. The conductive material comprises copper.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A method comprising:
    forming a via hole in a substrate, the via hole having a sidewall surface and a bottom surface, the substrate comprising a photosensitive layer, the via hole extending into the photosensitive layer of the substrate;
    forming a dielectric layer on the substrate, the dielectric layer covering the sidewall surface and the bottom surface of the via hole in the substrate;
    after the forming the dielectric layer, performing an annealing process on the dielectric layer;
    completely removing the dielectric layer from the sidewall surface of the via hole; and
    forming a conductive material in the via hole in the substrate.

2. The method of claim 1, wherein the substrate comprises a glass substrate.

3. The method of claim 2, wherein the glass substrate comprises a photo-sensitive glass material.

4. The method of claim 1, wherein the dielectric layer comprises a phosphosilicate glass (PSG) layer.

5. The method of claim 1, wherein the dielectric layer comprises a borophosphosilicate glass (BPSG) layer.

6. The method of claim 1, wherein before forming the dielectric layer on the substrate, the substrate comprises mobile ions.

7. The method of claim 6, wherein after performing the annealing process on the dielectric layer, at least one of the mobile ions in the substrate is removed.

8. The method of claim 6, wherein the mobile ions comprise sodium ions.

9. The method of claim 1, wherein the conductive material comprises copper.

10. The method of claim 1, wherein the via hole has a via depth to via diameter ratio greater than 10:1.

11. The method of claim 1, wherein forming the via hole in the substrate comprises:
    performing a light exposure on the substrate; and
    performing a wet etching process to remove exposed portions of the substrate.

12. A method comprising:
    forming a via hole in a substrate, wherein the substrate comprises mobile ions;
    forming a dielectric layer on sidewalls and bottom surfaces of the via holes;
    after the forming the dielectric layer, removing at least one of the mobile ions from the substrate; and
    completely removing the dielectric layer from sidewalls and bottom surfaces of the via holes.

13. The method of claim 12, wherein the dielectric layer comprises a phosphosilicate glass (PSG) layer.

14. The method of claim 12, wherein the dielectric layer comprises a borophosphosilicate glass (BPSG) layer.

15. The method of claim 12, wherein the substrate comprises a photosensitive glass material.

16. The method of claim 12, wherein the mobile ions comprise alkaline ions.

17. The method of claim 12, wherein removing the mobile ions comprises performing an annealing process on the dielectric layer.

18. The method of claim 12, further comprising forming a conductive material in the via hole after removing the dielectric layer.

19. The method of claim 12, wherein the via hole has a via depth to via diameter ratio greater than 10:1.

20. The method of claim 12, wherein forming the via hole in the substrate comprises:
    performing a light exposure on the substrate; and
    performing a wet etching process to remove exposed portions of the substrate.

* * * * *